United States Patent [19]

Gelinas

[11] Patent Number: 4,491,795

[45] Date of Patent: Jan. 1, 1985

[54] JOSEPHSON JUNCTION INTERFEROMETER DEVICE FOR DETECTION OF CURL-FREE MAGNETIC VECTOR POTENTIAL FIELDS

[75] Inventor: Raymond C. Gelinas, Concord, Mass.

[73] Assignee: Honeywell Inc., Minneapolis, Minn.

[21] Appl. No.: 378,926

[22] Filed: May 17, 1982

[51] Int. Cl.³ .................... G01R 33/035; H01L 39/22
[52] U.S. Cl. .................... 324/248; 307/306; 357/5
[58] Field of Search ............... 324/248, 260, 244, 225; 307/306; 335/216; 357/5

[56] References Cited

U.S. PATENT DOCUMENTS

| | | | |
|---|---|---|---|
| 2,914,735 | 11/1959 | Young | 307/306 X |
| 3,275,930 | 9/1966 | Cassidy et al. | 307/306 |
| 3,384,809 | 5/1968 | Meyerhoff et al. | 307/306 |
| 3,386,050 | 5/1968 | Dayem et al. | 307/306 |
| 3,534,602 | 10/1970 | Boyd | 324/173 UX |
| 3,956,727 | 5/1976 | Wolf | 307/306 X |
| 4,097,802 | 6/1978 | Mahopac | 324/252 |

OTHER PUBLICATIONS

Ketchen et al., *Shielded Thin Film Squid System*, IBM Technical Disclosure Bulletin, vol. 25, No. 1, Jun. 1982, pp. 45-47.

*Primary Examiner*—Gerard R. Strecker
*Attorney, Agent, or Firm*—William W. Holloway, Jr.; John S. Solakian; Laurence J. Marhoefer

[57] ABSTRACT

A device for detecting and/or measuring the presence of a magnetic vector potential "field" including two Josephson devices in a Josephson interferometer configuration, a magnetic shielding envelope with apertures arranged so that the magnetic vector potential is confined to the vicinity of one of the two Josephson devices (but not the interferometer loop region) and a means for detecting magnetic flux induced by the interaction of the Josephson device and the magnetic vector potential "field". The detection of the magnetic vector potential offers a more advantageous range of dependence than the magnetic flux density.

11 Claims, 3 Drawing Figures

JOSEPHSON JUNCTION INTERFEROMETER DEVICE FOR DETECTION OF CURL-FREE MAGNETIC VECTOR POTENTIAL FIELDS

RELATED APPLICATIONS (1) "Apparatus and Method for Demodulation of a Modulated Curl Free Magnetic Vector Potential Field" by Raymond C. Gelinas with U.S. Patent Office Ser. No. 198,325, filed on Oct. 20, 1980, now U.S. Pat. No. 4,429,280.

(2) "A Vector Potential Communication System" by Raymond C. Gelinas with U.S. Patent Office Ser. No. 198,324, filed on Oct. 20, 1980, now U.S. Pat. No. 4,432,098.

(3) "Apparatus and Method for Distance Determination By Means of Curl-Free Magnetic Vector Potential Field" by Raymond C. Gelinas with U.S. Patent Office Ser. No. 198,326, filed on Oct. 20, 1980.

(4) "Apparatus and Method for Modulation of a Curl-Free Magnetic Vector Potential Field" by Raymond C. Gelinas with U.S. Patent Office Ser. No. 198,380, filed on Oct. 20, 1980, now U.S. Pat. No. 4,429,288.

(5) "Apparatus and Method for Direction Determination By Means of Curl-Free Magnetic Vector Potential Field" by Raymond C. Gelinas with U.S. Patent Office Ser. No. 198,553, filed on Oct. 20, 1980, now U.S. Pat. No. 4,447,779.

BACKGROUND OF THE INVENTION

1. Field of the Invention

This invention relates generally to the detection of electromagnetic fields, and more particularly to the direct detection of the magnetic vector potential "field" associated with the electromagnetic field.

2. Description of the Related Art

It is known in the related art to utilize a Josephson interferometer, that is, a pair of Josephson devices coupled by two superconducting leads, to detect the presence of a magnetic flux which is applied through the interferometer loop. This class of devices is known as superconducting quantum interference devices or SQUID devices.

It is also known in the prior art that the magnetic fields of ordinary electromagnetic theory can be derived from a magnetic vector potential function. It is also known in the prior art that if a magnetic vector potential $\overline{A}$ is of form $\overline{A} = \overline{A}_1 + \overline{A}_2$ where $\overline{\nabla} \times \overline{A}_2 = 0$, than $\overline{A}_2$ does not contribute to the formation of the ordinary observable magnetic fields because $\overline{B} = \overline{\nabla} \times \overline{A}$. Early literature has discussed whether the $\overline{A}$ vector potential "field" had any observable physical effect, or if the $\overline{A}$ potential was merely a useful artifact in performing computations. With the advent of quantum mechanics, the inclusion of both the electric scalar potential and the magnetic vector potential in the Hamiltonian equation of motion for the electron reinforced the recognition that the magnetic vector potential does in fact result in observable physical phenomenon. One observable phenomenon is the generation of so-called supercurrent across a Josephson junction. This effect has made possible the use of the magnetic vector potential as a carrier of information. However, for practical use of the magnetic vector potential "field" as a carrier of information, better more sensitive detection of the magnetic vector potential "field" is desirable.

OBJECTS OF THE INVENTION

It is therefore an object of the present invention to provide an improved device for the detection of the magnetic vector potential "field" associated with the electromagnetic field.

It is another object of the present invention to utilize a Josephson interferometer in an improved device for the detection of the magnetic vector potential "field".

It is a more particular object of the present invention to utilize magnetic shielding material in conjunction with a Josephson interferometer to localize the external magnetic fields on one Josephson device of the interferometer.

SUMMARY OF THE INVENTION

The aforementioned and other objects of the present invention are accomplished by surrounding the Josephson interferometer with magnetic field shielding material. Apertures are placed in the shielding material so that the magnetic fields are limited to a vicinity of one of the Josephson devices comprising the Josephson interferometer. The interaction of the magnetic vector potential "field" with the Josephson device results in a circulating supercurrent in the interferometer loop which, in turn, induces flux through the interferometer loop. The induced magnetic flux can either be detected directly, or an external current source can be introduced across the interferometer and the effect of the induced flux on the superconducting critical current can be determined.

These and other features of the present invention will be understood upon reading of the following description along with the drawings.

DETAILED DESCRIPTION OF THE APPARATUS

Figure 1:
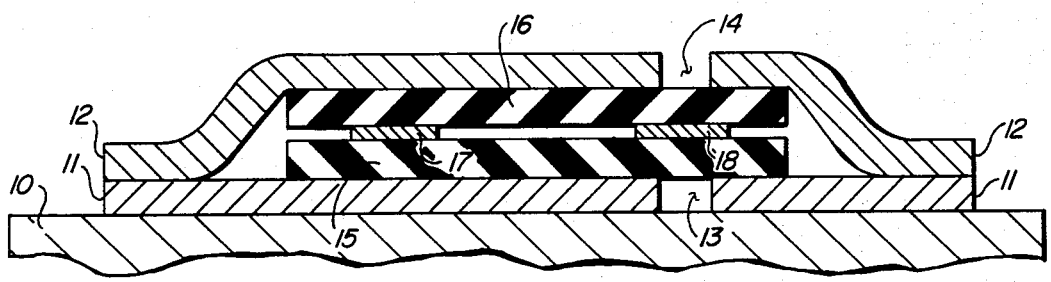
FIG. 1 is a lateral cross-sectional view of the magnetic vector potential "field" detector according to the present invention.

Referring now to FIG. 1, a cross-sectional diagram of the detector is shown. A layer of material 11 for shielding magnetic fields is placed upon an electrically insulating substrate 10. Material 11 can be a type I superconductor or any suitable magnetic field shielding material. Material 11 has an aperture 13 extending through the material, the function of which will be described below. A nonmagnetic insulating layer 15 is positioned on material 11. Positioned on material layer 15 is a Josephson device interferometer. The cross-section view of FIG. 1 indicates the two Josephson junctions 17 and 18 that are part of the interferometer. A layer of nonmagnetic insulating material 16 is positioned next to the Josephson device interferometer. Positioned next to the nonmagnetic insulation material 16 is a layer of magnetic material 12 for shielding magnetic fields. The shielding material 12 has an aperture 14 formed therein and the Josephson device 18 is situated between apertures 13 and 14. Except for apertures 13 and 14, materials 11 and 12 are generally enclosed nonmagnetic insulating materials 15 and 16 and Josephson devices 17 and 18.

Figure 2:
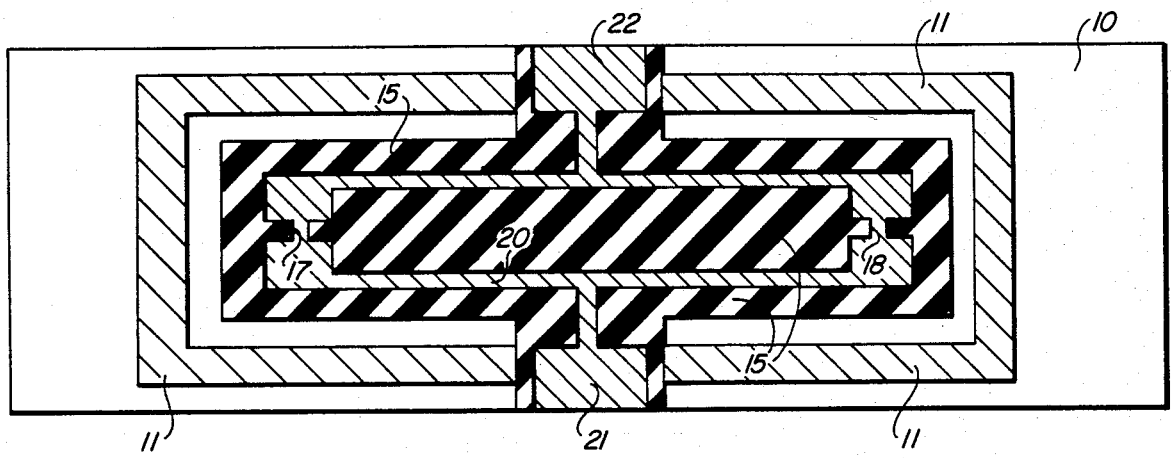
FIG. 2 is a top cross-sectional view of the magnetic vector potential "field" detector according to the present invention.

Referring next to FIG. 2, a schematical cross-section view of the inventive detector is shown. In the cross-sectional view of FIG. 2, a detecting device is shown located on substrate 15 and surrounded by magnetic material 11. The whole device is located on substrate 10. The detector itself is comprised of Josephson junction 17 and Josephson junction 18 coupled by superconducting materials 20. In addition, coupled to the superconducting materials 20 joining the Josephson junctions are conductor pads 21 and 22 which lead to outside circuitry. The apertures 14 and 13 of FIG. 1 are placed in close proximity to Josephson junction 18 but the aperture does not permit magnetic fields entering the apertures to intrude into the interior of the circuit loop formed by superconductors 20 and the Josephson junctions 17 and 18.

Figure 3:
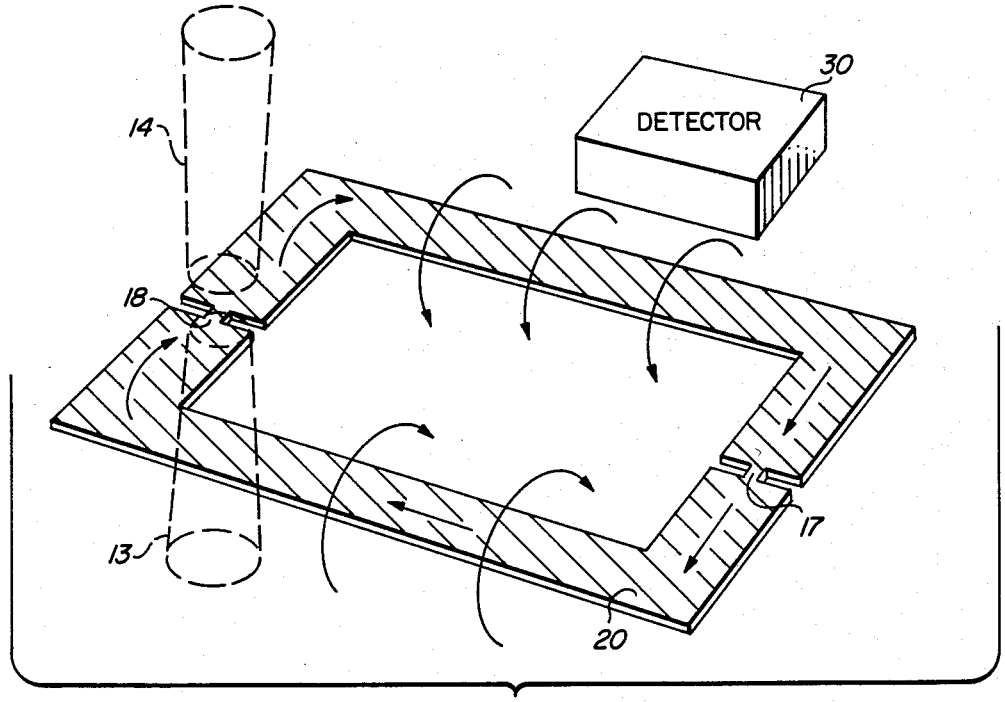
FIG. 3 is a perspective view of the Josephson interferometer, indicating the current and flux induced by the magnetic vector potential "field".

Referring to FIG. 3, a schematic of the magnetic vector potential "field" detector is shown. The Josephson junctions 18 and 17 are coupled by superconductors 20, forming a circuit loop. Apertures 13 and 14 are positioned above and below Josephson junction 18. Also shown in FIG. 3 is detector 30 which is arranged to detect magnetic fields.

The Josephson junction device which is placed between the apertures 13 and 14 must be oriented so that the vector potential associated with the external magnetic flux admitted through the apertures pass through the Josephson device gap. The relation between magnetic vector potential "field" $\overline{A}$ and the magnetic flux density $\overline{B}$ is given by the formula $\overline{B}$=the curl of $\overline{A}$ or $\overline{B} = \overline{\nabla} \times \overline{A}$. Thus $\overline{A}$ lies in a plane normal to the direction of $\overline{B}$. The requirement that $\overline{A}$ pass through the Josephson device when $\overline{B}$ passes through the apertures may be met by the use of a Josephson microstrip device. The self inductance of the Josephson interferometer must be sufficiently high so that the measurable value of self induced flux is produced through the Josephson interferometer loop by production of the circulating supercurrent. The supercurrent is caused by the imbalance of the vector potential through the interferometer Josephson devices. In this configuration, the value of magnetic flux passing through the interferometer loop is dominated by self induced magnetic flux. In normal usage, the external magnetic flux is passed through the interferometer loop. In the instant invention, the magnetic shielding material is arranged so as to exclude substantially the external magnetic flux from the interferometer loop. The length of the Josephson junction should be smaller than the coherence lengths of the Cooper pairs, the bound pairs of electrons associated with the microscopic theory of superconduction. Meeting this condition establishes a definite known length of the Josephson device over which a magnetic vector potential "field" must act. Josephson devices must be small so as to render negligible self-shielding effects on the Josephson device due to the Josephson supercurrent. The Josephson devices must furthermore be sufficiently small so that the uniform magnetic field of maximum value of concern associated with the vector potential "field" is approximately constant across the Josephson device. The Josephson interferometer is available to external circuitry through conducting pads 21 and 22. These normal contacts, placed across the interferometer, are coupled to external circuitry that, in this embodiment, measures the critical current of the Josephson interferometer. Over the Josephson interferometer is placed another layer of nonmagnetic insulating material of sufficient thickness as to provide electrical isolation between the interferometer and the final magnetic shield to be described. On the upper surface of the last mentioned insulator is deposited a final film of magnetic shielding material. A small aperture 14 is made in this layer of magnetic shielding material directly over the Josephson device and in line with the first aperture 13 previously made in the first layer of magnetic shielding material. The size and placement of the insulating layers and the Josephson interferometer with respect to the substrates are such that both the first and second layers of magnetic shielding material can be extended past their boundaries so that the magnetic shielding material layers join together on the substrate encasing the Josephson interferometer in the enclosed cavity. Sufficient extension of this joined region on the substrate is arranged so as to eliminate penetration of an external magnetic field into the interior cavity any where except the location of the two small apertures 13 and 14. The purpose of the magnetic shielding cavity is to allow interaction of the magnetic vector potential "field" associated with the external flux to occur only at one of the Josephson devices and, in particular, to prevent the external magnetic flux from passing through the loop area of the Josephson interferometer. In summary, this embodiment may be described as a specially designed Josephson interferometer having large self inductance, encased in a magnetic shield having apertures that provide means for admitting a magnetic vector potential "field" from an external source only at the location of one of the Josephson devices of the two comprising the interferometer. A provision is made for external electrical contact across the interferometer by which a critical current determination can be determined.

OPERATION OF THE PREFERRED EMBODIMENT

The presence of an external magnetic field acting on one of the Josephson devices by means of admittance into cavity by small apertures results in a magnetic vector potential acting across the Josephson device. For a sufficiently small width Josephson device this results in the production of a Josephson supercurrent, $I_J$, across the Josephson device given by $$I_J = I_0 \sin\left(\delta_o - \frac{2e}{\hbar} \int_1^2 \overline{A} \cdot d\overline{l}\right) \text{ where} \quad (1)$$

where
$\delta_o$ is an initial (arbitrary) phase term
e is the electronic charge
$\hbar$ is the Planck's constant
$\underline{A}$ is the magnetic vector potential
$d\overline{l}$ is the differential of length across the Josephson device and integral is taken across the Josephson device length.

The argument of the sine function of equation (1) is gauge invariant with respect to the magnetic vector potential "field", $\overline{A}$. It is therefore always possible to select a specific gauge of $\overline{A}$ such that the arbitrary constant, $\delta_o$, is zero for the sake of convenience in calculations. Designating such a gauged vector potential as $\overline{A}_g$, equation (1) may be simplified to:

$$I_j = I_o \sin\left(\frac{2e}{\hbar} \int_1^2 \overline{A}_g \cdot d\overline{l}\right) \quad (2)$$

Because the magnetic vector potential "field" associated with external magnetic field is allowed to interact with only one of the Josephson devices (and not with the other Josephson device) an imbalance is produced in the Josephson interferometer giving rise to a circulating supercurrent around the interferometer loop. From continuity requirements, this circulating supercurrent must be the same Josephson supercurrent as given by the simplified Josephson equation (2). This circulating supercurrent will have been caused by the action of an imbalance in externally applied magnetic vector potential through the two Josephson devices. This circulating supercurrent will in turn give rise to a self-induced magnetic flux that threads through the Josephson interferometer loop as a secondary effect. The self-induced magnetic flux, $\Phi_L$, is given by $$\Phi = LI_j\hat{n} = LI_o \cdot \hat{n}\sin\left(\frac{2e}{\hbar} \int_1^2 \overline{A}_g \cdot d\overline{l}\right) \quad (3)$$

where

L is the inductance of the Josephson interferometer, and $\hat{n}$ is the unit vector normal to the plane defined by the interferometer loop according to the right-handed rule convention.

Now the critical current $I_c$ of the Josephson interferometer, as determined by external circuitry, will behave as a function of the total magnetic flux that passes through the Josephson interferometer loop. Since the configuration of the invention limits the total magnetic flux through the interferometer loop to be only the self-induced magnetic flux (i.e. the devices are designed to exclude the externally applied magnetic flux from threading the interferometer loop), the critical current response is determined completely by the self-induced magnetic flux. In symbols the critical current, $I_c$, is given by $$I_c = \left|\frac{I_o}{2}\cos\left(\frac{\pi\Phi_2}{\Phi_o}\right)\right| = \left|\frac{I_o}{2\cos}\left[\frac{\pi L I_o}{\Phi_o}\text{SIN}\left(\pi \int_1^2 \frac{\overline{A}_g \cdot d\overline{l}}{\Phi_o}\right)\right]\right| \quad (4)$$

where $\Phi_o$ is the quantum flux unit, h/2e

The critical current response of this device is given in equation (4) in terms of an externally applied vector potential imbalance $\overline{A}_g$ associated with a magnetic field. The critical current response can be determined in terms of the external magnetic field using the relation $$\overline{B} = \overline{\nabla} \times \overline{A}_g$$

where $\overline{B}$ is the external magnetic flux density $\overline{\nabla} \times$ is the mathematical curl operation.

All currently available apparatus for detecting and/or measuring the presence of an external magnetic field depends on an interaction of an element of the apparatus directly with the external magnetic flux as a principle of operation. Such interaction results in an observable change of state in the apparatus. An external magnetic field, when expressed in terms of its source, (i.e., electrical currents, magnets, etc.) is found to decrease in magnitude with increasing range from the source of the magnetic field can, in general, be expressed as a multipole expansion of the magnetic source by well-known methods. In general, it is found that the magnetic field intensity will decrease with range from the magnetic source, in a manner inversely proportional to the range taken to some power or a sum of such terms involving the factor $1/R^n$ (where R is the range) with n increasing at each term. For example, the simplest case is a dipole magnetic source. For this case, the magnetic field intensity at ranges larger than the source dimensions can be expressed by:

$$\overline{B} = \hat{b} K/R^3 \quad (6)$$

where $\hat{b}$ is the unit vector in the $\overline{B}$ direction Hence, for a dipole magnetic source the magnetic field intensity (and hence the magnetic flux through a standard area) falls off with range as $\propto 1/R^3$ The principle of operation of this invention rests on a direct detection of magnetic vector potential "field" associated with an external magnetic field and not on detection of the magnetic flux per se. Because the magnetic field is releated to the vector potential by equation (5), the relationship between the magnetic vector potential "field" and range is seen to be of a lower power by one unit than that for the associated magnetic field. Thus, in the dipole example given, where $\overline{B} \propto 1/R^3$, the corresponding magnetic vector potential "field", $\overline{A}$, will have the form $$\overline{A} \propto 1/R^2 (i \cdot e\, \overline{A} \propto 1/R^{(3-1)}).$$

This result is entirely general. That is, if the magnetic field intensity is found related to range according to $\overline{B} \propto (1/R)^n$, then the corresponding vector potential will have the relationship: $\overline{A} \propto (1/R)^{n-1}$. This characteristic of the magnetic vector potential "field" provides an important advantage for obtaining useful detection ranges not available to devices based on magnetic flux detection as a principle of operation.

To illustrate this advantage consider a dipole magnetic source. For a given sensitivity of detection device a maximum range $R_{max}$ will be found beyond which detection of the magnetic field will no longer be possible. Therefore, for a device based on detection of magnetic flux by a superconducting quantum interferometer device (SQUID), $$R_{max} = \left(\frac{K}{|B_{min}|}\right)^{\frac{1}{3}} \quad (7)$$

and for this invention based on detection by magnetic vector potential "field":

$$R^1_{max} = \left( \frac{K}{|A\min|} \right)^{\frac{1}{2}} \quad (8)$$

For purposes of illustration, a configuration can be chosen such that $R_{max}$ is approximately the same for both devices. Being based on Josephson effect interferometers, both devices are subject to the same noise limiting mechanisms. Let us now increase the strength of the magnetic source by some factor, say $F = 10^3$. This will result in increasing the maximum detectable range by a factor of 10 ($=F^{\frac{1}{3}}$) for the SQUID device whose operating principle is based on detection of magnetic flux. However, for this invention whose operating principle is based on detection of the corresponding magnetic vector potential "field" the maximum detection range will be increased by the much larger amount 31.6 ($=F^{\frac{1}{2}}$).

From this is seen that a basic advantage in this invention for detection and/or measurement of external magnetic fields lies in the more favorable range characteristic of the magnetic vector potential "field" as compared with associated magnetic fields.

The above description is included to illustrate the operation of the preferred embodiment and is not meant to limit the scope of the invention. The scope of the invention is to be limited only by the following claims. From the above description, many variations would be apparent to one skilled in the art that would yet be encompassed by the spirit and scope of the invention.

What is claimed is:

1. A device for detecting and measuring a magnetic vector potential field comprising:
    a Josephson interferometer device including two Josephson junction devices coupled by superconducting elements, and magnetic field shielding means shielding said Josephson interferometer device from magnetic fields, said shielding means have apertures positioned so that said magnetic vector potential field impinges substantially only on one Josephson device in said Josephson interferometer device.

2. The device for detecting and measuring a magnetic vector potential of claim 1 further including detection means coupled to said superconducting elements for detecting a supercurrent in said Josephson interferometer device induced by said magnetic vector potential field.

3. Apparatus for detecting a magnetic vector potential field comprising:
    an interferometer device including
    a first Josephson junction;
    a second Josephson junction coupled to said first Josephson junction by superconducting materials; and
    magnetic shielding material enclosing said interferometer device, said magnetic shielding having apertures therein positioned so that said magnetic vector potential fields are applied only to said first Josephson junction.

4. The detection apparatus of claim 3 further including detecting means coupled to said superconducting materials for detecting induced supercurrents in said interferometer device resulting from said magnetic vector potential field.

5. The detection apparatus of claim 3 further including detection means, said detection means for detecting magnetic flux fields produced by supercurrents induced in a loop formed by said first and second Josephson junction and said superconducting materials by said magnetic vector potential field.

6. The detection apparatus of claim 3 further including detecting means for measuring changes in an interferometer device critical current resulting from an interferometer supercurrent resulting from said magnetic vector potential field.

7. Apparatus for detection of a magnetic vector potential field comprising:
    a first Josephson junction device;
    a second Josephson junction device;
    a first and second superconductor coupling said first and said second Josephson junction in a series configuration; and
    shielding means for shielding said magnetic field vector potential field from one of said Josephson junctions and from said first and second superconductors, said magnetic vector potential field applied only to said second Josephson junction device.

8. Apparatus for detection of a magnetic vector potential field of claim 7 further including means for detection of a supercurrent in said series configuration.

9. Apparatus for detecting a magnetic vector field comprising:
    an interferometer including a first superconducting material and a second superconducting material, said superconducting materials coupled together at two locations to form Josephson junctions; and
    magnetic shielding means enclosing said interferometer, said magnetic shielding means having apertures arranged to permit said magnetic vector potential field to interact with one of said Josephson junctions, said apertures including a first aperture and a second aperture permitting said magnetic vector potential field to pass through said apparatus, said apertures arranged to limit said magnetic vector potential field to substantially said one Josephson junction.

10. Apparatus for detecting a magnetic vector potential field comprising:
    a first substrate comprised of a non-conducting material;
    a second substrate comprised of a non-conducting material;
    a Josephson interferometer positioned between said first and said second substrates, said Josephson interferometer including two superconducting materials coupled at two Josephson junctions; and a magnetic shielding material enclosing said substrates, said magnetic shielding material including apertures permitting said magnetic vector potential fields to pass through said apparatus, said apertures limiting said magnetic vector potential field to one of said Josephson junctions.

11. The apparatus for detecting a magnetic vector potential field of claim 10 further including means for detection of magnetic field resulting from a supercurrent generated at said one Josephson junction by said magnetic vector potential field in a loop formed by said Josephson interferometer.

* * * * *